(12) United States Patent
Chen et al.

(10) Patent No.: US 6,744,105 B1
(45) Date of Patent: Jun. 1, 2004

(54) MEMORY ARRAY HAVING SHALLOW BIT LINE WITH SILICIDE CONTACT PORTION AND METHOD OF FORMATION

(75) Inventors: Cinti Xiaohua Chen, Mountain View, CA (US); Hiroyuki Kinoshita, Sunnyvale, CA (US); Jeff P. Erhardt, San Jose, CA (US); Weidong Qian, Sunnyvale, CA (US); Jean Yee-Mei Yang, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/382,731

(22) Filed: Mar. 5, 2003

(51) Int. Cl.[7] .............................................. H01L 29/76
(52) U.S. Cl. ...................... 257/382; 257/384; 257/456; 257/486; 257/576; 257/768; 257/757; 438/300; 438/48; 438/92; 438/570; 438/648; 438/650
(58) Field of Search ........................ 257/377, 382–384, 257/454–456, 485–486, 576, 768, 587, 751, 754–757, 769, 388, 407, 770, 412–413

(56) References Cited

U.S. PATENT DOCUMENTS

| | | | |
|---|---|---|---|
| 6,020,254 A | * | 2/2000 | Taguwa ........................ 438/618 |
| 6,215,702 B1 | | 4/2001 | Derhacobian et al. |
| 6,309,926 B1 | | 10/2001 | Bell et al. |
| 6,320,261 B1 | * | 11/2001 | Burton et al. ................ 257/754 |
| 6,344,994 B1 | * | 2/2002 | Hamilton et al. ......... 365/185.05 |
| 6,456,533 B1 | | 9/2002 | Hamilton et al. |
| 6,495,921 B1 | * | 12/2002 | Burton et al. ................ 257/774 |
| 6,645,801 B1 | * | 11/2003 | Ramsbey et al. ............ 438/216 |

* cited by examiner

Primary Examiner—David Nelms
Assistant Examiner—Andy Huynh
(74) Attorney, Agent, or Firm—Renner, Otto, Boisselle & Sklar, LLP

(57) ABSTRACT

A core memory array having a plurality of charge trapping dielectric memory devices. The core memory array can include a substrate having a first semiconductor bit line and a second semiconductor bit line formed therein and a body region interposed between the first and the second bit lines. Over the body region can be formed a first dielectric layer disposed, a dielectric charge trapping layer and a second dielectric layer. At least one word line can be disposed over the second dielectric layer, which defines a channel within the body region. Each bit line can include a bit line contact assembly having a locally metalized portion of the bit line and a conductive via traversing a dielectric region.

8 Claims, 3 Drawing Sheets

MEMORY ARRAY HAVING SHALLOW BIT LINE WITH SILICIDE CONTACT PORTION AND METHOD OF FORMATION

TECHNICAL FIELD

The present invention relates generally to the field of non-volatile memory devices and, more particularly, to a charge trapping dielectric core memory array which can have shallow bit lines and silicide contact portions. Certain aspects of the present invention relate to a method of fabricating a core memory array.

BACKGROUND

A pervasive trend in modern integrated circuit manufacture is to increase the amount of data stored per unit area on an integrated circuit memory unit, such as a flash memory unit. Memory units often include a relatively large number of core memory devices (sometimes referred to as core memory cells). For instance, a conventional dual cell memory device, such as a charge trapping dielectric flash memory device, can store data in a "double-bit" arrangement. That is, one bit can be stored using a first charge storing region on a first "side" of the memory device and a second bit can be stored using a second charge storing region on a second "side" of the memory device.

In a conventional charge trapping dielectric flash memory device, the charge storing regions are part of a nonconductive charge trapping layer that is disposed between a bottom (or tunnel) dielectric layer and a top dielectric layer. This dielectric stack can be formed over a P conductivity type silicon substrate having a series of bit lines disposed therein. The bit lines can be formed by implanting impurities into the substrate to form N+ conductivity regions. In conventional charge trapping dielectric core memory arrays, the bit lines are implanted through each of the top dielectric layer, charge trapping layer and bottom dielectric layer with relatively high energy ions.

A series of conductive word lines made from polycrystalline silicon (also referred to as poly-silicon or poly-Si) is formed over the dielectric stack for serving as a gate electrode for each memory device. The core memory devices can be addressed by applying appropriate voltages to the word line and/or the bit lines. During programming and reading of the core memory devices, the bit lines can function as a source (i.e. source of electrons or holes) and a drain with an active channel region defined therebetween.

Between a predetermined number of word lines, conductive vias can traverse the dielectric stack to establish electrical contact to the bit lines. For bit lines made from N+ conductivity silicon, sets of vias (one via for each bit line) can be placed at intervals of about eight to about sixteen word lines. More specifically, the sets of vias are placed sufficiently close together to minimize adverse effects of bit line resistance (e.g., about 100 ohms/cm$^2$ for N+ doped silicon) on programming and reading of core memory devices that are relatively remote from the vias. However, the vias consume value room within the core memory array. In effect, the vias displace word lines that, along with respect pairs of bit lines, can be used to operatively form core memory devices.

In view of the foregoing, there is a need in the art for an improved core memory array with a reduced number of vias and method of forming same.

SUMMARY OF THE INVENTION

According to one aspect of the invention, the invention is directed to a core memory array having a plurality of charge trapping dielectric memory devices. The core memory array can include a substrate having a first semiconductor bit line and a second semiconductor bit line formed therein and a body region interposed between the first and the second bit lines; a first dielectric layer disposed over the body region; a dielectric charge trapping layer disposed over the first dielectric layer, a second dielectric layer disposed over the charge trapping layer; at least one word line disposed over the second dielectric layer and defining a channel within the body region, and for each bit line, a bit line contact assembly including a locally metalized portion of the bit line and a conductive via traversing a dielectric region.

According to another aspect of the invention, the invention is directed to a method of fabricating a core memory array. The method can include providing a substrate; forming a first dielectric layer over the substrate; forming a dielectric charge storing layer over the first dielectric layer; forming a second dielectric layer over the charge storing layer; removing portions of the at least the second dielectric layer and the charge trapping layer to form at least two longitudinally disposed bit line implant windows; and implanting impurities into the substrate to form bit lines in the substrate and defined by the implant windows.

BRIEF DESCRIPTION OF DRAWINGS

These and further features of the present invention will be apparent with reference to the following description and drawings, wherein.

DISCLOSURE OF INVENTION

Figure 1:
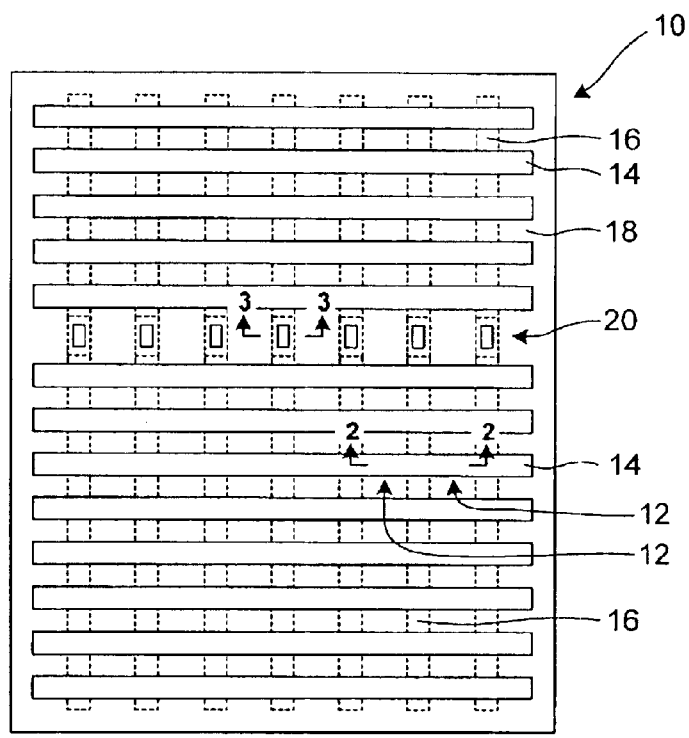
FIG. 1 is a schematic block diagram of a portion of a core memory array from a memory unit formed in accordance with the present invention.

In the detailed description that follows, like components have been given the same reference numerals, regardless of whether they are shown in different embodiments of the present invention. To illustrate the present invention in a clear and concise manner, the drawings may not necessarily be to scale and certain features may be shown in somewhat schematic form.

With reference to FIG. 1, shown is a top view schematic block diagram of a portion, or sector, of a core memory array 10 from a memory unit. The core memory array 10 can include a plurality of core memory devices 12. In accordance with certain aspects of the invention and as discussed in greater detail below, the memory devices 12 can be implemented as dual cell, charge trapping dielectric memory devices. In addition, each memory device 12 can be considered a virtual ground, dual cell, non-volatile, flash electrically erasable and programmable memory device 12.

The memory unit can also include a logic circuit (not shown) for use in controlling various operations (e.g., programming, reading and/or erasing) of the core memory array 10. The memory unit can also include external (or static) references (not shown) for using in generating various reference currents, such as an erase verify reference, a soft-program verify reference and a program verify reference. As one skilled in the art will appreciate, the core memory devices 12 can be used by a customer of the memory unit to store information, such as data or executable code.

The core memory array 10 can include a plurality of word lines 14 (also referred to as gate lines) and bit lines 16. The word lines 14 are disposed over and separated from the bit lines 16 by a dielectric stack 18 in a grid arrangement (e.g., the word lines 14 are disposed in a transverse direction to the bit lines 16). The word lines 14, the bit lines 16 and the dielectric stack are operatively arranged to form the core memory devices 12. Although not described in great detail herein, some of the core memory devices 12 can be used as dynamic reference devices to assist in reading the remaining core memory devices 12 by tracking drift in threshold voltage of the core memory devices 12 over multiple program/erase (P/E) cycles and aging of the memory unit.

Application of appropriate voltages to the word lines 14 and the bit lines 16 allows for the addressing of the memory devices 12 of the sector core memory array such that each memory device 12 can be programmed, read, verified and/or erased. Bit line contact assemblies 20 can be used to establish electrical connection to the bit lines 16 through the dielectric stack 18.

Figure 2:
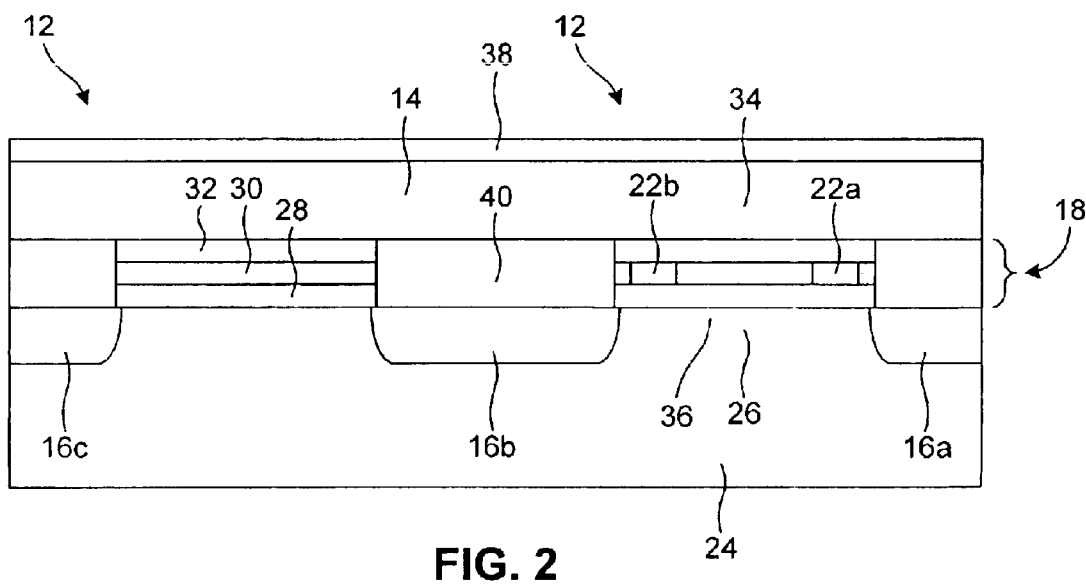
FIG. 2 is a schematic cross-section illustration of exemplary memory devices from the core memory array taken along the line 2—2 of FIG. 1.

With additional reference to FIG. 2, a portion of the core memory array 10 is illustrated in cross-section to illustrate an exemplary arrangement of the memory devices 12 of the core memory array 10. It should be understood that the illustrated memory devices 12 are shown for exemplary purposes and can be implemented with alternative structures (e.g., in stacked gate arrangement, in recessed gate arrangement, etc.). The exemplary memory devices 12 are implemented as charge trapping dielectric type flash memory devices, each of which include a pair of complimentary charge trapping regions 22a, 22b that can be independently programmed and read.

In the illustrated embodiment, the core memory device 12 is fabricated on a semiconductor substrate 24 having P type conductivity. In one embodiment, the substrate 24 can be formed from silicon (Si). Within the substrate 24, the bit lines 16 are formed in a buried bit line format. The bit lines 16 (which function as conductive regions) can be formed by implanting N type dopant into the substrate 24. In one embodiment, the bit lines 16 have N+ conductivity. Although not illustrated, a nitride layer can be formed at least partially over the bit lines 16 and P+ pocket implants can be added adjacent the bit lines 16.

For each core memory device 12, adjacent pair of bit lines 16 form conductive regions that function as a source and a drain during various programming and reading operations. For each device, a body 26 is disposed between the adjacent pairs of bit lines 16.

Above the substrate 24 is the dielectric stack 18. The dielectric stack 18 includes a bottom dielectric layer 28 (also referred to as a tunneling dielectric layer) that is made from, for example, silicon oxide (e.g., $SiO_2$) or other suitable material.

Over the bottom dielectric layer 28 is a charge trapping layer (also referred to as a charge storing layer 30). The charge storing layer 30 can be made from, for example, a non-conductive dielectric material such as silicon nitride ($Si_3N_4$) or other suitable material.

Over the charge storing layer 30 is another dielectric layer (also referred to as a top dielectric layer 32) made from a material such as, for example, silicon oxide (e.g., $SiO_2$) or other suitable material. Alternative materials for the dielectric layers 28 and 32 can include high-K dielectric materials (e.g., dielectric materials having a relative permittivity greater than the relative permittivity of silicon oxide).

The word lines 14 are formed over the top dielectric layer 32. For each core memory device 12, one of the word lines 14 functions as a gate electrode 34 that, in part, controls a channel 36 interposed between the adjacent pairs bit lines 16. In alternative arrangements, the gate electrodes 34 can be formed from interconnected islands or pads. A work function of the word line 14 and the dielectric stack 18, in part, controls the channel 36 (e.g., inversion or depletion state) within the body 24. Each word line 14 can include a highly conductive layer 38 formed on the upper surface of the word lines 14. For example, the conductive layer 38 can be formed from a silicide, such as $CoSi_x$.

Disposed over the bit lines 16, the dielectric stack 18 can include dielectric regions, also referred to herein as a first inter-layer dielectric (ILD-1) 40. As will be described in greater detail below, the inter-dielectric layer 40 can assist in filling voids formed in the tunnel dielectric layer 28, the charge trapping layer 30 and the top dielectric layer 32. The voids are formed as part of a method for fabricating the core memory array and to assist in bit line 16 implantation by serving as bit line 16 implant windows.

Figure 3:
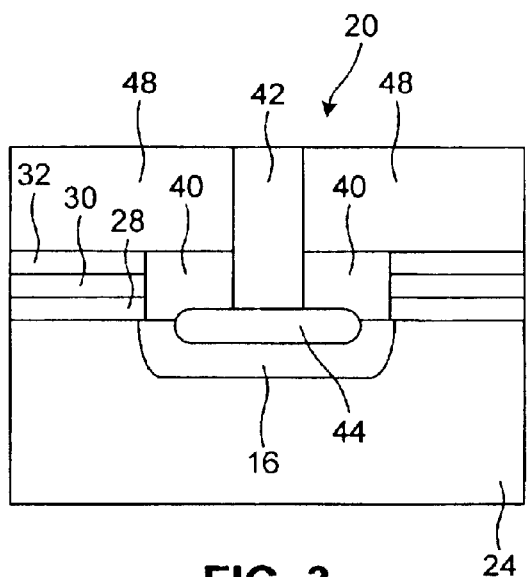
FIG. 3 is a schematic cross-section illustration of an exemplary bit line contact region from the core memory array taken along the line 3—3 of FIG. 1.

With additional reference to FIG. 3, shown is a schematic cross-section illustration of an exemplary bit line contact region from the core memory array 10. Each bit line contact region can include a bit line contact assembly 20 that can be used to establish electrical connection to the corresponding bit line 16 through the layer 40.

The bit line contact assembly includes a conductive via 42 that vertically traverses the dielectric region 40 for establishing election connection between an interconnect (not shown) and the bit line 16. The bit line contact assembly 20 can also include a metalized portion 44 of the bit line 16. The metalized portion 44 can be formed from a silicide material, such as the result of reacting a metal (e.g., cobalt, molybdenum, titanium, nickel, etc) with the silicon of the bit line 16. This locally metalized portion 44 of the bit line 16 can reduce bit line 16 resistance (e.g., cobalt-silicon having a resistance of about five ohms/$cm^2$ to about twelve ohms/$cm^2$). Accordingly, sets of bit line contact assemblies 20 can be spaced apart by a higher number of word lines 14 than found in conventional core memory arrays. For example, sets of bit line contact assemblies 20 (one bit line contact assembly 20 for each bit line 16) can be placed at placed at intervals of about 128 to about 256 word lines. In the illustrated embodiment, the metalized portions 44 extend vertically downward from an upper surface of the substrate 24 a distance less than the junction depth (described in greater detail below) of the bit lines 16. In another embodiment, the metalized portions 44 extend vertically downward from an upper surface of the substrate 24 a distance that coincides with the junction depth of the bit lines 16 or is deeper than the bit lines 16.

As will become more apparent from the discussion below, within the charge storing layer 30, the memory device 12 includes the first charge trapping region 22a (also referred to herein as a normal cell, a right-hand bit or a first charge storing cell) adjacent one of the conductive regions (e.g., the bit line identified as bit line 16a) and the second charge trapping region 22b (also referred to herein as a complimentary cell, a left-hand bit or a second charge storing cell) adjacent the other of the conductive regions (e.g., the bit line identified as bit line 16b).

Each charge storing cells 22a, 22b can independently have two data states. The data states can represent binary values such as a logical zero and a logical one. The logical one, for example, can be implemented by leaving the desired charge storing cell 22 in an unprogrammed state or blank program level. The logical zero, for example, can be implemented by storing an amount of charge in the desired charge storing cell 22. This condition is also referred to as a charged state, a programmed state, a programmed level or a charged program level.

In the illustrated embodiment, the memory device 12 is a structurally symmetrical device allowing for programming, verifying, reading and erasing of the first charge storing cell 22a and the second charge storing cell 22b by respectively switching the roles of the bit lines 16a and 16b (source and drain) during those operations. Therefore, the bit lines 16a, 16b will be referred to interchangeably by the terms source and drain, depending on the charge storing cell 22 of interest.

For purposes of the present disclosure, the programming technique to store the charged program level with either of the charge storing cells 22 involves hot electron injection, also referred to as channel hot electron injection (CHE). However, it should be appreciated that modifications to the programming techniques can be made to accommodate variations in the specific memory device used.

Using hot electron injection, the first charge storing cell 22a can be programmed to the charged program level by applying a voltage potential (e.g., about three volts to about six volts) to the bit line 16a (functioning as the drain) and a voltage potential (e.g., about eight volts to about ten volts) to the word line 14 (functioning as the gate electrode 34). The other bit line 16b functions as the source (i.e., source of electrons) for the CHE programming of the charge storing cell 22a. In one embodiment, a bias voltage potential is also applied to the source (rather than grounding or floating the source as found in conventional charge trapping dielectric flash memory devices). As a result of the application of a bias potential to the source during programming, greater control over electron injection can be accomplished, which leads to enhanced data retention capability of the memory device 12.

The voltages applied to the gate electrode 34, the source and the drain generate a vertical electric field through the dielectric layers 28, 32 and the charge storing layer 30 and a lateral electric field along the length of the channel 36 from the source to the drain. At a given threshold voltage, the channel 36 will invert such that electrons are drawn off the source and begin accelerating toward the drain. As the electrons move along the length of the channel 36, the electrons gain energy and upon attaining enough energy, the electrons are able to jump over the potential barrier of the bottom dielectric layer 28 and into the charge storing layer 30 where the electrons become trapped. The probability of electrons jumping the potential barrier is a maximum in the area of the charge storing cell 22a adjacent the drain (i.e., bit line 16a), where the electrons have gained the most energy. These accelerated electrons are termed hot electrons and once injected into the charge storing layer 30, tend to stay in the charge storing cell 38 of the charge storing layer 30. The trapped electrons tend not to spread through the charge storing layer 30 due to this layer's low conductivity and low lateral electric field therein. Thus, the trapped charge remains localized in the charge trapping region of the charge storing cell 22a close to the adjacent bit line 16a.

The foregoing technique to program the first charge storing cell 22b can be used to program the second charge storing cell 22b, but the functions of the bit lines 16a and 16b (i.e., source and drain) are reversed.

Reading of the charge storing cells 22 of the memory device 12 can be carried using, for example, a reverse read operation. For example, to read the first charge storing cell 22a, a voltage potential (e.g., about 1.3 volts to about two volts) can be applied to the conductive region opposite the first charge storing region 22a (i.e., bit line 16b, which is also referred to as the drain during read operations) and a voltage potential (e.g., about 4.5 volts to about 5.5 volts) can be applied to the word line 14 (function as the gate electrode 34). The conductive region adjacent the first charge storing region 22a (i.e., bit line 16a, which is also referred to as the source during read operations) can be grounded. To read the second charge storing cell 22b, the roles of the conductive regions can be reversed. The read operation drain voltage functions to mask, or "cover up," charge stored by the "unread" charge storing cell 22. During the read operation of the memory device 12 an amount of current drawn across the channel 36 can be compared against a reference current to determine the data state of the "read" one of the charge storing cells 22.

Erasing the charge storing regions 22 can be accomplished by an appropriate technique. For example, a hot hole injection band-to-band (BTB) erase operation can be used.

As one skilled in the art will appreciate, modifications to the memory devices 12 described herein can be made. Such modifications can include changes to the physical arrangement of the memory devices 12, materials used, doping parameters and the like.

Figure 4:
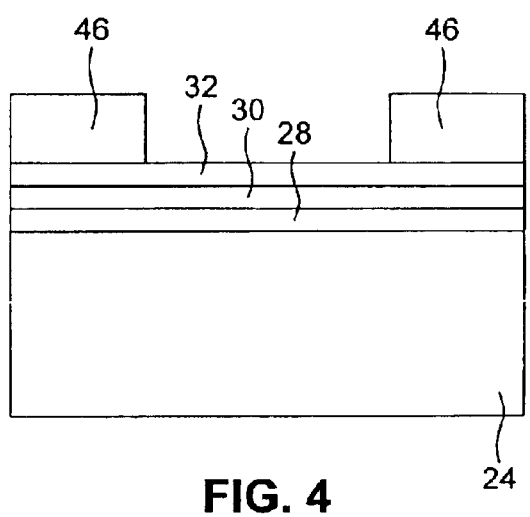
FIGS. 4 through 7 are schematic cross-section illustrations of the exemplary bit line contact region from the core memory array take along the line 3—3 of FIG. 1 and representing various stages of manufacture.

With additional reference to FIG. 4, a method of fabricating the core memory array 10 will be described in greater detail. The method can begin by providing the substrate 24. The substrate can be made from silicon that has been initial doped with P type impurities (e.g., by implanting boron ions, gallium ions or indium ions). Thereafter, the tunnel dielectric layer 28 can be formed from silicon oxide (e.g., $SiO_2$) by subjecting the substrate 24 to a thermal cycle in an oxygen rich atmosphere. It is note that implantation of the P type impurities can be deferred until after the tunnel dielectric layer 28 is formed.

Next, the charge trapping layer 30 can be formed by depositing a layer of suitable material (e.g., silicon nitride or $Si_3N_4$) over the tunnel dielectric layer 28. Thereafter, the top dielectric layer 32 can be formed by forming a layer of suitable material (e.g., silicon oxide or $SiO_2$) over the charge trapping layer 30. In one embodiment, the top dielectric layer 32 can be formed by an oxide regrowth technique such as a high temperature oxidation (HTO) process or a tetraethyl orthosilicate (TEOS) process.

The tunnel dielectric layer 28, the charge trapping layer 30 and the top dielectric layer 32 can be uniformly formed across the substrate 24 in the area used to form the core memory array 10. After the layers 28, 30 and 32 have been formed, a mask layer 46 can be formed. The mask layer 46 can be formed from, for example, a photoresist that is patterned using photolithographic techniques. The mask layer 46 can be patterned into a series of lines and spaces where the lines cover the layers 28, 30 and 32 where the core memory devices 12 are formed and the spaces expose the layers 28, 30 and 32 where the bit lines 16 will be formed.

Figure 5:
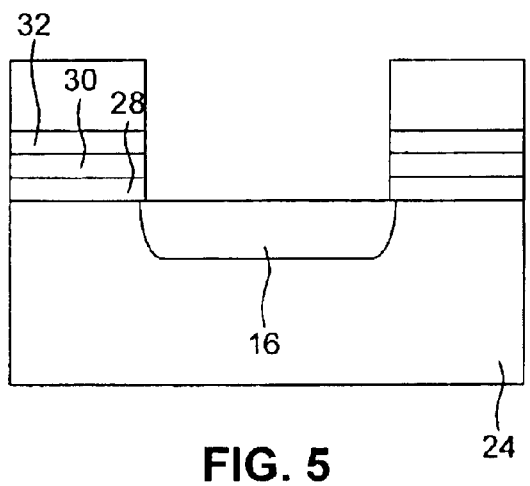

With additional reference to FIG. 5, the layers 28, 30 and 32 can be etched in the areas left exposed by the mask layer 46 to expose the substrate 24. In an alternative embodiment, the top dielectric layer 32 and the charge trapping layer 30 are etched and the tunnel dielectric layer 28 is left in place as an implant screen.

The etched portions of the layers 30, 32 and/or 28 form voids in these layers that serve as implant windows for bit line implantation. More specifically, N type ions can be implanted into the substrate 24 to form the bit lines 16. For example, arsenic ions, phosphorous ions, or antimony ions can be implanted with sufficient energy and dose to form N+ conductivity regions in the substrate between the spaces in the mask layer 46. In one embodiment, arsenic ions can be implanted with a dose of about $1\times10^{15}$ atoms/cm$^2$ to about $1.5\times10^{15}$ atoms/cm$^2$ and an energy of about 40 keV to about 50 keV. After implantation, the wafer can be annealed to activate the implanted ions. Some of the implanted ions may diffuse slightly under the layers 28, 30 and 32 protected by the mask layer 46.

It is noted that the implant dose and energy can each be reduced from the levels used during convention bit line implantation where the ions are implanted through each of the layers 28, 30 and 32. In addition, the bit lines 16 can be "shallower" than conventional implanted bit lines and with less lateral diffusion. For example, the bit lines 16 can have a junction depth (e.g., a distance from an upper surface of the substrate 24 to a bottom portion of the bit lines 16) of about 450 angstroms to about 550 angstroms. Conventional bit line formation can involve implanting arsenic ions through the layers 28, 30, 32 with a dose of about $2.5\times10^{15}$ atoms/cm$^2$ and an energy of about 70 keV to result in bit lines with a junction depth of about 1000 angstroms.

Figure 6:
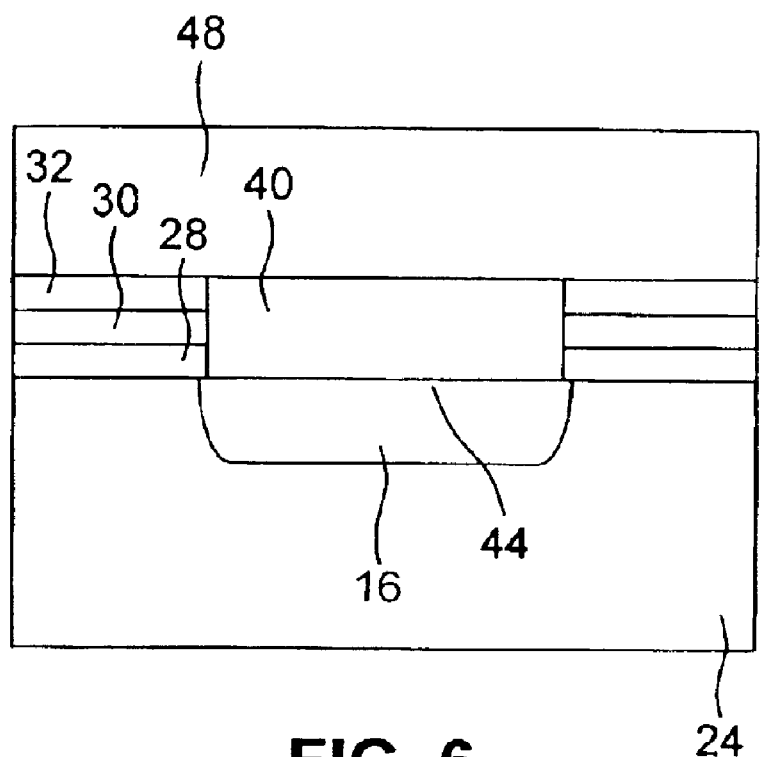
Figure 7:
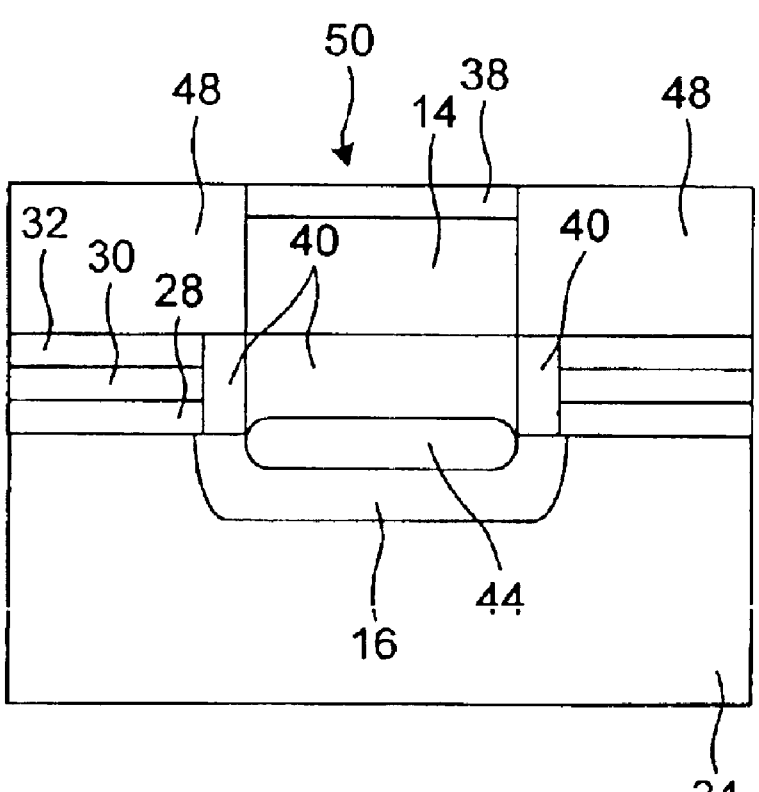

With additional reference to FIGS. 6 and 7, the method can continue by removing the mask layer 46. The voids (or bit line 16 implant windows) formed in the layers 30, 32 and, if etched, 28 can be filled by a suitable dielectric material such as silicon oxide (e.g., $SiO_2$) formed by an appropriate process such as HTO or TEOS. The material formed in the voids forms the dielectric regions 40.

Thereafter, the word lines 14 can be formed. For example, a layer of poly-silicon can be formed over the top dielectric layer 32 and the dielectric regions 40. The layer of poly-silicon can then be etched into the individual word lines 14 using a protective mask that is patterned using a photolithographic process. At this point, dielectric material, or a second interdielectric layer (ILD-2) 48, can optionally be formed between word lines 14. Alternatively the ILD-2 48 can be formed after word line 14 silicidation as described below.

Next, a bit line contact assembly opening 50 can be formed in the dielectric regions 40 to expose each bit line 16 at the desired interval between word lines 14. The opening 50 can also be formed through the ILD-2 48, if formed at this stage of the method. The opening 50 can also extend through the tunnel dielectric layer 28 if the tunnel dielectric layer 28 is still present.

Next, a layer of metal (e.g., cobalt, molybdenum, titanium, nickel, etc) can be deposited to at least cover the portions of each bit line 14 exposed by the opening 50 and the upper surfaces of the word lines 14. The metal is reacted with the silicon of the bit lines 16 and the word lines 14 to respectively form the locally metalized portion 44 of the bit lines 14 and the highly conductive layers 38. It is noted that the metalized portions 44 are localized to the openings 50 and are thus considered self-aligned to the openings 50 (e.g., the portions 44 can be formed by salicidation). As a result, the metalized portion 44 of each bit line contact assembly 20 can be disposed between a first and a second word line 14 with longitudinal ends of the metalized portions 44 (the longitudinal axis running along the length of the bit lines 16) formed in an area vertically defined by the adjacent word lines 14. In addition, each metalized portion is defined by the bit line contact assembly opening 50 formed through the top dielectric layer 32, the charge trapping layer 30 and the tunnel dielectric layer 28 above the bit line 16 and between a first and a second adjacent word line 14.

Thereafter, the openings 50 can optionally be filled, or partially filled, with an insulating material (e.g., silicon oxide) to reduce the size of the openings 50. Within the filled openings 50, a hole can be opened (in not already opened) that can be filled with a conductive material (e.g., a metal or metal containing material) to form the vias 42.

Next, any additional dielectric layers, conductive layers, interconnect layers and so forth can be formed using conventional techniques.

As should be apparent, the foregoing method can be modified as desired to form desired properties of the core memory array 10. For instance, the order of steps can be modified, certain steps can be omitted and/or additional steps can be added. In addition, the specified materials, doping parameters and so forth can be modified.

Although particular embodiments of the invention have been described in detail, it is understood that the invention is not limited correspondingly in scope, but includes all changes, modifications and equivalents coming within the spirit and terms of the claims appended hereto.

What is claimed is:

1. A core memory array having a plurality of charge trapping dielectric memory devices, comprising:

a substrate having a first semiconductor bit line and a second semiconductor bit line formed therein and a body region interposed between the first and the second bit lines;

a first dielectric layer disposed over the body region;

a dielectric charge trapping layer disposed over the first dielectric layer;

a second dielectric layer disposed over the charge trapping layer;

at least one word line disposed over the second dielectric layer and defining a channel within the body region, and for each bit line, a bit line contact assembly including a locally metalized portion of the bit line and a conductive via traversing a dielectric region, wherein the bit line contact assemblies are disposed between a first and a second word line and the metalized portion of each bit line contact assembly has longitudinal ends formed in an area vertically defined by the first and second word lines.

2. The core memory array according to claim 1, wherein the bit lines have a junction depth of about 450 angstroms to about 550 angstroms.

3. The core memory array according to claim 1, where the word line includes a metalized layer formed thereon.

4. The core memory array according to claim 3, wherein the word line metalized layer and the metalized portions of the bit lines are formed by respectfully reacting a metal with the word line and the bit lines in a single process step.

5. A core memory array having a plurality of charge trapping dielectric memory devices, comprising:

a substrate having a first semiconductor bit line and second semiconductor bit line formed therein and a body region interposed between the first and the second bit lines;

a first dielectric layer disposed over the body region;

a dielectric charge trapping layer disposed over the first dielectric layer;

a second dielectric layer disposed over the charge trapping layer;

at least one word line disposed over the second dielectric layer and defining a channel within the body region, and for each bit line, a bit line contact assembly including a locally metalized portion of the bit line and a conductive via traversing a dielectric region, wherein each metalized portion is defined by a bit line contact assembly opening formed through the first dielectric layer, the charge trapping layer and the second dielectric layer above the bit line and between a first and a second word line.

6. The core memory array according to claim 5, wherein the bit lines have a junction depth of about 450 angstroms to about 550 angstroms.

7. The core memory array according to claim 5, where the word line includes a metalized layer formed thereon.

8. The core memory array according to claim 7, wherein the word line metalized layer and the metalized portions of the bit lines are formed by respectfully reacting a metal with the word line and the bit lines in a single process step.

* * * * *

UNITED STATES PATENT AND TRADEMARK OFFICE
CERTIFICATE OF CORRECTION

PATENT NO. : 6,744,105 B1  Page 1 of 1
DATED : June 1, 2004
INVENTOR(S) : Chen et al.

It is certified that error appears in the above-identified patent and that said Letters Patent is hereby corrected as shown below:

Column 2,
Line 7, replace "layer," with -- layer; --.

Column 8,
Line 64, after "and" insert -- a --.

Signed and Sealed this

Eighth Day of February, 2005

JON W. DUDAS
*Director of the United States Patent and Trademark Office*